(12) United States Patent
Nasser-Faili et al.

(10) Patent No.: US 7,939,367 B1
(45) Date of Patent: May 10, 2011

(54) METHOD FOR GROWING AN ADHERENT DIAMOND LAYER ATOP AN INTERLAYER BONDED TO A COMPOUND SEMICONDUCTOR SUBSTRATE

(75) Inventors: Firooz Nasser-Faili, Los Gatos, CA (US); Niels Christopher Engdahl, San Jose, CA (US)

(73) Assignee: Crystallume Corporation, Lincoln, CA (US)

( * ) Notice: Subject to any disclaimer, the term of this patent is extended or adjusted under 35 U.S.C. 154(b) by 285 days.

(21) Appl. No.: 12/338,783

(22) Filed: Dec. 18, 2008

(51) Int. Cl.
*H01L 21/00* (2006.01)
(52) U.S. Cl. .................. 438/105; 428/833.2; 428/835; 427/249.7; 427/249.8; 257/77; 257/E23.111; 257/E21.041; 257/E21.049; 257/E21.095; 257/E21.096; 257/E21.105; 257/E21.107; 257/E21.182; 257/E21.27
(58) Field of Classification Search .................. None
See application file for complete search history.

(56) References Cited

U.S. PATENT DOCUMENTS

| | | | |
|---|---|---|---|
| 5,169,676 A * | 12/1992 | Moran et al. ................. | 427/575 |
| 5,236,545 A | 8/1993 | Pryor | |
| 5,353,737 A | 10/1994 | Koyama et al. | |
| 5,455,432 A | 10/1995 | Hartsell et al. | |
| 5,527,559 A | 6/1996 | Simpson | |
| 5,667,852 A * | 9/1997 | Kulik et al. .................... | 427/577 |
| 5,916,005 A * | 6/1999 | Baik et al. ........................ | 445/51 |
| 7,312,415 B2 | 12/2007 | Ohmi et al. | |
| 2004/0038033 A1* | 2/2004 | Massler et al. ................ | 428/408 |
| 2005/0186345 A1 | 8/2005 | Shibata et al. | |

* cited by examiner

*Primary Examiner* — Charles D Garber
*Assistant Examiner* — Yasser A Abdelaziez
(74) *Attorney, Agent, or Firm* — Costello Law Corp.; John P. Costello

(57) ABSTRACT

The invention is a method for growing a critical adherent diamond layer on a substrate by Chemical Vapor Deposition (CVD) and the article produced by the method. The substrate can be a compound semiconductor coated with an adhesion layer. The adhesion layer is preferably a dielectric, such as silicon nitride, silicon carbide, aluminum nitride or amorphous silicon, to name some primary examples. The typical thickness of the adhesion layer is one micrometer or less. The resulting stack of layers, (e.g. substrate layer, adhesion layer and diamond layer) is structurally free of plastic deformation and the diamond layer is well adherent to the dielectric adhesion layer such that it can be processed further, such as by increasing the thickness of the diamond layer to a desired level, or by subjecting it to additional thin film fabrication process steps. In addition to preventing plastic deformation of the layer stack, the process also reduces the formation of soot during the CVD process. The reduction of soot allows for better adhesion between the adhesion layer and diamond layer of the layer stack.

25 Claims, 2 Drawing Sheets

METHOD FOR GROWING AN ADHERENT DIAMOND LAYER ATOP AN INTERLAYER BONDED TO A COMPOUND SEMICONDUCTOR SUBSTRATE

TECHNICAL FIELD

This invention relates to compound semiconductors which have an adhesion layer coating wherein a diamond layer is grown upon and bonded to the adhesion layer.

BACKGROUND

It is known that the intimate proximity of a diamond layer upon integrated circuits and any other high power density devices makes for unexcelled performance at high temperature as well as for convenience of cooling, to list a few desirable characteristics. It is also known that these desirable features of a diamond layer upon an integrated circuit are vastly improved when the layer is maintained at high uniformity, without irregularities. Depositing a diamond layer by chemical vapor deposition (CVD) is known to be one of the best methods for achieving a uniform diamond layer with high power density devices or other forms of integrated circuits. It is known to those familiar with the art that diamond CVD is typically performed by one of three major methods. Namely, 1) plasma enhanced diamond CVD (from DC, RF, or microwave energy sources); 2) hot-filament enhanced diamond CVD (primarily super hot tungsten wires as the source of energy); and 3) high velocity plasma torch diamond CVD. It is further known to those familiar with the art that all of the aforementioned processes result in the generation of significant heat from the plasma and/or highly heated wires, as well as, from highly significant exothermic recombination of atomic hydrogen on all surfaces closest to the plasma, or super hot wires.

The CVD process is carried out in an evacuated reaction chamber having a compound semiconductor substrate or a combination of semiconductor layers with other possible layers on some substrate placed therein, the top surface being covered with a diamond-friendly adhesion layer. "Diamond-friendly" means materials that have the potential to form binary or ternary chemical bonds with carbon. In essence the superior adhesion of diamond to these materials is not just a function of surface treatment and mechanical interlocking, but also of chemical bonding. Using CVD, the diamond layer is grown directly upon the diamond-friendly adhesion layer material which is preferably a dielectric such as silicon nitride, silicon carbide, aluminum nitride, or amorphous silicon, to name some examples. The carbon for growing the diamond layer is supplied by at least one carbon-bearing gas in a mixture with other reactive and possibly non-reactive (diluent) gases introduced into the reaction chamber for the CVD process. Almost always the carbon-bearing gas(es) are introduced into the process chamber in combination with hydrogen gas. Typically hydrogen comprises up to 90 to 99%, by volume of all gases supplied into the reaction chamber. Typical carbon-bearing gases used for such applications include $CH_4$, $C_2H_6$, CO, and $C_2H_2$, with $CH_4$ being the preferred gas for most such processes.

While CVD is the best known process for growing a diamond layer on the adhesion layer, there are aspects to CVD which require improvement for successful application of a diamond layer onto a compound semiconductor layer, and it is in these areas of improvement that this invention is directed. First, despite the benefits gained in growing diamond layers on standard compound semiconductor layers or compound semiconductor substrates through CVD, the underlying structures are not immune to plastic deformation (warpage). Warpage of any kind renders, at best, a substrate that will exhibit sub-par performance, and is therefore essentially useless. Warpage originates in the substrate due to nonuniform heating of the substrate when power directly or indirectly is ramped to the substrate either at too fast a rate or nonuniformly. So far the art has not obtained success at avoiding warpage on standard manufacturing-level compound semiconductor substrates (having a typical thickness range of 0.3 mm to 0.7 mm), during diamond layer growth through CVD. Some success has been achieved in avoiding warpage with non-standard semiconductor substrates, relating mainly to small parts in a research and development context, but never at a manufacturing level. These experimental parts typically have thicknesses of over two millimeters. Secondly, application of the carbon-bearing gas in too high of a concentration for a particular adhesion layer material will result in non-adhesion of the diamond layer due to high carbon soot formation at the deposition interface. Thirdly, application of carbon-bearing gas at too low of concentration could result in etching of the adhesion layer, resulting in direct but non-reproducible adhesion between the diamond and the compound semiconductor.

The foregoing reflects the state of the art of which the inventor is aware, and is tendered with a view toward discharging the inventor's acknowledged duty of candor, which may be pertinent to the patentability of the present invention. It is respectfully stipulated, however, that the foregoing discussion does not teach or render obvious, singly or when considered in combination, the inventor's claimed invention.

SUMMARY OF THE INVENTION

The invention is a method for achieving an adherent diamond layer on a compound semiconductor layer or substrate that would be further processed to fabricate integrated circuits such as transistors, power amplifiers, or microprocessors, to name some examples. Using Chemical Vapor Deposition (CVD) methods, diamond is grown directly upon a substrate having a diamond-friendly adhesion layer. The substrate can be a compound semiconductor coated with an adhesion layer. The adhesion layer is preferably a dielectric, such as silicon nitride, silicon carbide, aluminum nitride or amorphous silicon, to name some primary examples. The typical thickness of the adhesion layer is one micrometer or less. The resulting stack of layers, (e.g. substrate layer, adhesion layer and diamond layer) is structurally free of plastic deformation and the diamond layer is well adherent to the dielectric adhesion layer such that it can be processed further, such as by increasing the thickness of the diamond layer to a desired level, or any additional thin film fabrication process steps.

The CVD method is carried out in an evacuated reactor within which the substrate having the dielectric adhesion layer is placed. A mixture of reactive gases, that includes at least one form of a carbon-bearing gas is introduced into the reactor and maintained at a specified concentration. Power is applied to the reactor, at a ramped rate, to maintain a temperature differential between the center of the substrate and the edge of the substrate of less than 80° Celsius. The final processing temperature of the substrate is mostly maintained at between 700° C. to 900° C., but always less than 1200° C. These conditions are maintained to assure the growth of an adherent diamond layer upon the adhesion layer of the substrate.

Accordingly, the following objects and advantages of the invention apply:

It is an object of this invention to provide a CVD method for growing a diamond layer upon a diamond-friendly adhesion layer of a substrate that does not cause the substrate to undergo any irreversible plastic deformation.

It is another object of this invention to provide a CVD method for growing a diamond layer upon an adhesion layer of a substrate that prevents the formation of excessive soot or other loosely adherent forms of carbon atop the interlayer, and thus degrading the adhesion between the subsequent diamond layer and the adhesion layer.

Further objects and advantages of the invention will be brought out in the following portions of the specification, wherein the detailed description is for the purpose of fully disclosing the preferred embodiments of the invention, without placing limitations thereon.

BRIEF DESCRIPTION OF THE DRAWINGS

The invention will be more fully understood by reference to the following drawings which are for illustrative purposes only.

DETAILED DESCRIPTION OF THE PREFERRED EMBODIMENTS

The inventive method as described herein allows a substrate having an adhesion layer to have a diamond layer grown onto the adhesion layer while at the same time preventing the substrate from undergoing any irreversible plastic deformation during growth of the diamond layer. Additionally, the method insures that the formation of excessive soot in the Chemical Vapor Deposition (CVD) reactor environment is kept to a minimum so as not to degrade the bonding between the diamond layer and the adhesion layer. The method achieves its advantages through the sequence of steps which comprise the method. This sequence of steps includes the steps of managing the rate of power ramp to the substrate and further managing the concentration of carbon-bearing gas introduced to the reactor environment depending upon the composition of the adhesion layer.

Figure 1A:
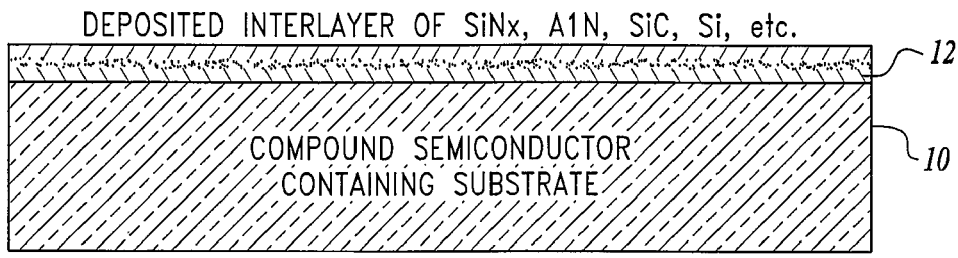
FIG. 1A is a front view of a compound semiconductor substrate upon which the inventive method is performed.

Referring now to FIG. 1A, the substrate for growing the diamond layer through the inventive method is shown. The substrate 10 is comprised of a compound semiconductor, the substrate further having an adhesion layer coating 12. The adhesion layer 12 serves to adhere the diamond layer to the substrate 10 and the adhesion layer covers the compound semiconductor. The adhesion layer 12 is selected from the group comprising silicon nitride, silicon carbide, aluminum nitride and amorphous silicon to name some preferred examples.

Figure 1B:
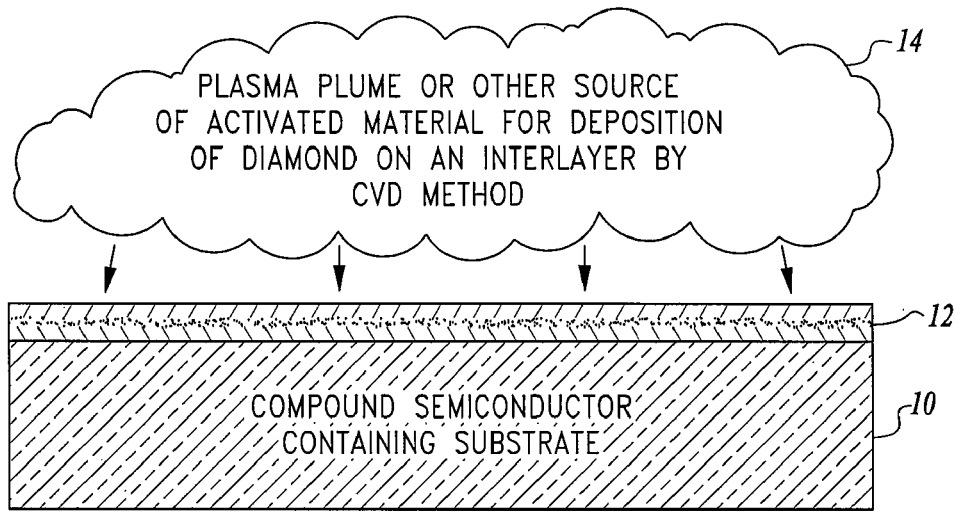
FIG. 1B is a front view of the compound semiconductor substrate of FIG. 1A, shown with a plasma plume of activated species for depositing a diamond layer upon the substrate.
Figure 1C:
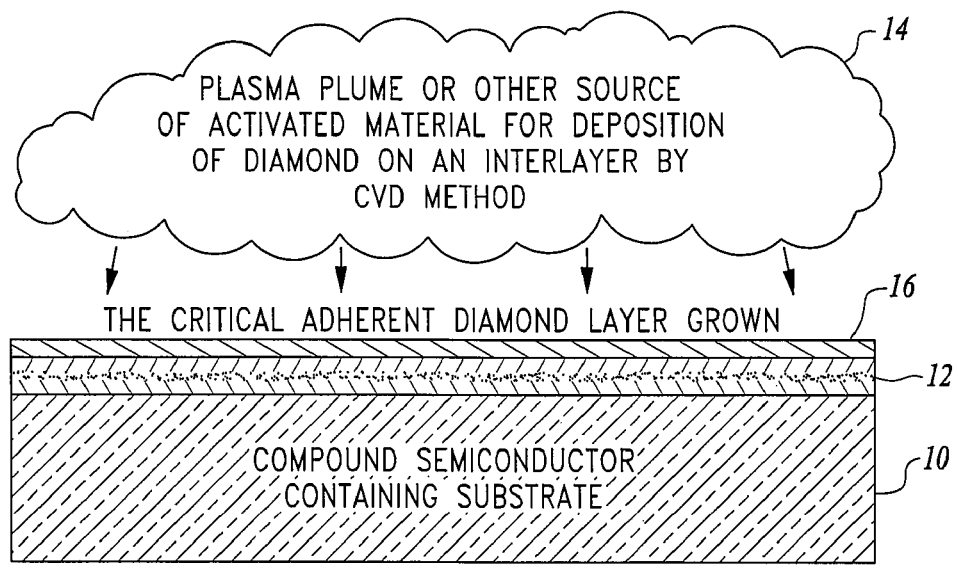
FIG. 1C is a continuing front view of the compound semiconductor substrate from FIG. 1B, showing the continued application of diamond deposition to cause the formation of a critical adherent diamond layer to the adherent layer of the substrate.
Figure 1D:
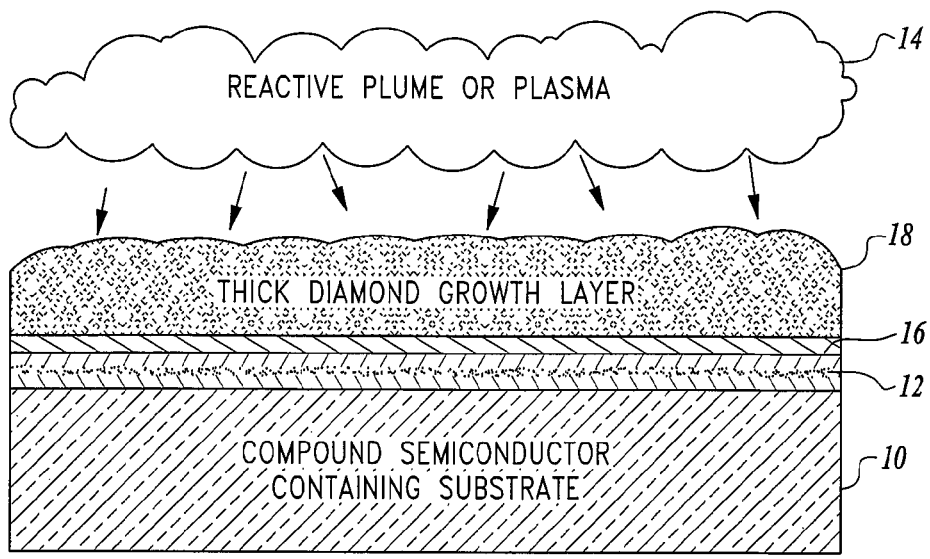
FIG. 1D is a continuing front view of the compound semiconductor substrate of FIG. 1C, showing the continued application of diamond deposition upon the critical adherent diamond layer until a thickened layer of diamond growth is achieved.

FIG. 1B shows a plasma plume 14 or other generating source of activated species gas, the species gas being comprised of hydrogen atoms and carbon-bearing radicals such as CH3 and CH2. The species gas provides a carbon source for deposition of diamond on the adhesion layer by the CVD method. FIG. 1C illustrates the continued application of diamond deposition until a critical adherent diamond layer 16 is grown. This critical adherent diamond layer 16 must achieve a bond of sufficient strength to allow for the continued deposition of diamond for achieving the full growth potential of the diamond layer 18 as shown in FIG. 1D.

Figure 2:
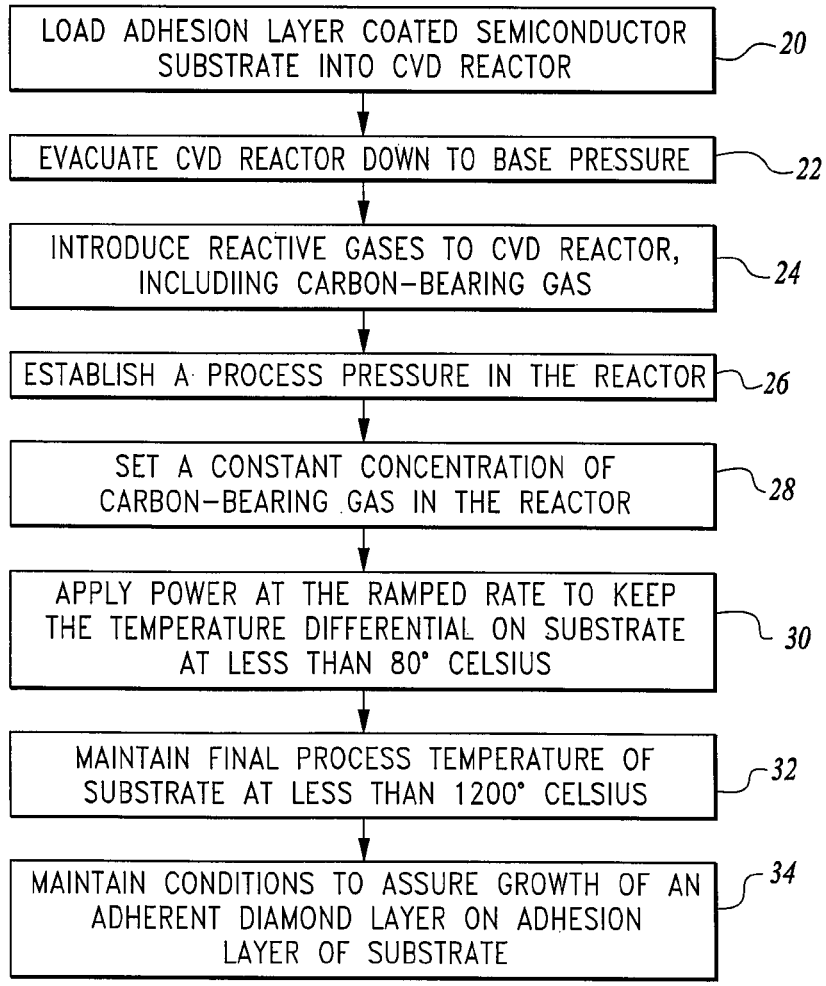

Referring also to FIG. 2, the method employs a diamond CVD reactor of a type for example manufactured by Fraunhofer IAF, SP3 Diamond Technologies or Crystallume, Inc. Adhesion layer coated compound semiconductor substrates are first loaded 20 into the diamond CVD reactor and the reactor is evacuated down to the base (lowest) pressure 22 achievable by the vacuum pump attached to the reactor. The adhesion layer 12 is comprised of a diamond-friendly dielectric material which characteristically bonds a diamond layer readily thereto. For purely exemplary purposes, preferred materials comprising the adhesion layer would include silicon nitride, silicon carbide, aluminum nitride and amorphous silicon.

Formation of the critically adherent diamond layer 16 upon the adhesion layer 12 is achieved via the inventive method by introducing a carbon-bearing gas into the CVD reactor 24 in concentrations that are specific to the composition of the adhesion layer. For example, an adhesion layer 12 composed of aluminum nitride would require a different concentration of carbon-bearing gas than one composed of silicon carbide. The carbon bearing gas may be selected from any standard gas typically used in CVD such as CH4, C2H6, C2H2, CO, and CHF3 with the preferred carbon bearing gas for use in the method being CH4.

As a result of the hot CVD diamond process plasma 14, hot wires (not shown) and hydrogen recombination, the substrate 10 heats up. The heat retained in the substrate naturally causes the substrate to deform, but the substrate 10 retains a certain level of natural elasticity from which the substrate can revert back to its original shape, without warpage, upon cooling. A problem arises when the natural elasticity of the substrate 10 is exceeded to a point where upon cooling, the substrate cannot return to its pre-heating natural shape, and remains warped upon cooling. The inventive method achieves a substrate 10 that is free of warpage by controlling the ramp up of power applied to the process gases and as a result of regulating heat transport to the substrate 10. By regulating heat transport to the substrate 10, the temperature differential between the center to edge of the substrate always remains within specific temperature parameters, and the final process temperature of the substrate does not exceed a specified maximum temperature.

According to the inventive method, adhesion layer coated compound semiconductor substrates 10 are loaded into a CVD reactor 20 which is evacuated down to the vacuum pump base pressure of the reactor 22. Reactive gases are introduced 24 into the chamber and a preset process pressure is established 26, which can range in between 5 to 500 Torr. The carbon-containing gas provides the carbon atoms necessary for building the first critical diamond adherent layer 16 which binds to the adhesion layer material 12. Sufficient bonding of the critical diamond adherent layer 16 to the adhesion layer 12 is crucial for building a uniform diamond layer 18 of a thickness for obtaining the full benefit of diamond thermal diffusivity. This diamond layer thickness is preferably at least greater than 25 micrometers to achieve sufficient thermal diffusivity. The concentration of the carbon-bearing gas is set 28 and maintained to assure the survival of the adhesion layer 12 during the subsequent power ramp step, prior to the formation of the initial, adherent diamond nucleation layer 16. Every deposition process also contains species that could etch away any exposed layer. In CVD diamond, atomic hydrogen is capable of etching away any and all of the adhesion layer 12. It is critical to include enough carbon-containing gas in this part of the process to form the initial layer of diamond, before the adhesion layer is damaged or consumed by the atomic hydrogen. Yet, it is further critical to choose the concentration of carbon-containing gas in such a way so as not to induce the formation of soot. Prevention of soot formation from the carbon-bearing gas results in a stronger bond between the adhesion layer 12 and the critical diamond adherent layer 16. Whilst it is possible to start the growth process for the adherent diamond layers atop of the diamond-friendly interlayer at the carbon-bearing concentration range of between 0.3% to 4.2%, of the total percentage of the reactive gases introduced to the CVD reactor, it has been found that specific concentrations of carbon-bearing gas work best with specific interlayer compositions. The following Table I represents interlayer specific, carbon-bearing gas concentrations as a total percentages of the reactive gases introduced to the CVD reactor for different adhesion layer materials. These concentrations have been found to create the best results for both bonding the adhesion layer 12 to the critical diamond adherent layer 16 (by assuring survival of the adhesion layer during power ramp up) and for preventing soot formation:

TABLE I

| Adhesion Layer Material | Concentration of Carbon-Bearing Gas |
|---|---|
| Aluminum nitride | 1.5% or less for initial deposition |
| Silicon nitride | 2.0% or less for initial deposition |
| Silicon carbide | 3.0% or less for initial deposition |
| Amorphous Silicon | 2.0% or less for initial deposition |
| Crystalline Silicon | 2.0% or less for initial deposition |

In further accordance with the inventive method, power is applied to the reactor and ramped at a proper rate 30 to initiate the dissociation of the gases and cause heating of the plasma plume 14, which in turn causes the substrate 10 to heat up. The power density is limited to no more than 3000 watts/in$^2$ and the ramp is controlled in such a manner that the temperature differential between the center of the compound semiconductor substrate and the edge of the substrate is always less than 80° Celsius. The ramp 30 is to be set at the maximum possible, while still maintaining the center to edge differential of the substrate at less than 80° Celsius. These power ramp conditions 30 allow for the elastic deformation of the substrate 10, while at the same time avoiding any plastic deformation of the substrate. The substrate 10 is heated to a desired final temperature 32, in almost all cases to less than 1200° Celsius, and in most cases to between 700°-900° Celsius. Once initial deposition of the diamond layer 16 upon the adhesion layer 12 has been achieved 34, the gas flows and relative concentrations of the carbon-bearing gas, as well as the process pressure, could be adjusted freely to optimize the growth rate and quality of the diamond layer 18 as desired. It is well known to those familiar with the art, that CVD diamond could be grown under a variety of process conditions. If, for example, the desired target is to maximize deposition rate a set of process condition could be used; if film stress or grain size is of outmost important, the process may require different adjustment(s).

The product produced by the method is a compound semiconductor 10 with an adhesion layer 12 coating that is chemically bonded to a heat-spreading diamond layer 18 that is: 1) well adherent enough to be processed further (namely subjecting the substrate to any processes that are standard for semiconductor fabrication such as adding more diamond growth, possible metallization, photolithography, etching and high temperature annealing to name some examples; 2) is free of any physical asymmetrical plastic distortion and 3) has a critical adherent diamond layer 16 that is located from one micrometer, to within a few atomic layers of the compound semiconductor layer.

Finally, although the description above contains much specificity, this should not be construed as limiting the scope of the invention, but as merely providing illustrations of some of the presently preferred embodiments of this invention. This invention may be altered and rearranged in numerous ways by one skilled in the art without departing from the coverage of any patent claims, which are supported by this specification.

The invention claimed is:

1. A method of growing a diamond layer upon an adhesion layer coating a compound semiconductor substrate, comprising:
    loading the adhesion layer coated compound semiconductor substrate into a chemical vapor deposition (CVD) reactor;
    evacuating the CVD reactor down to the vacuum base pressure of the reactor;
    introducing reactive gasses into the reactor, wherein at least one of the gasses is a carbon-bearing gas;
    establishing a process pressure in the reactor;
    setting a constant concentration of the carbon-bearing gas in the reactor;
    applying power to the reactor at any ramped rate to maintain a temperature differential between the center of the substrate and the edge of the substrate of less than 80° Celsius;
    maintaining the final process temperature of the substrate at less than 1200° Celsius; and
    maintaining said recited conditions to assure the growth of an adherent diamond layer upon the adhesion layer of the substrate.

2. The method of growing a diamond layer as recited in claim 1, further comprising maintaining the recited conditions until a desired thickness of diamond layer is grown upon the adherent diamond layer.

3. The method of growing a diamond layer as recited in claim 1, wherein the process pressure in the reactor is maintained in a range of 5 to 500 Torr.

4. The method of growing a diamond layer as recited in claim 1, wherein the carbon bearing gas is a gas having four carbon atoms.

5. The method of growing a diamond layer as recited in claim 1, wherein the carbon bearing gas is selected from the group consisting of CH4, C2H6, C2H2, CO, and CHF3.

6. The method of growing a diamond layer as recited in claim 1, wherein the adhesion layer is selected from the group consisting of silicon nitride, aluminum nitride and silicon carbide.

7. The method of growing a diamond layer as recited in claim 1, wherein the carbon bearing gas is maintained at a concentration of between 0.3% to 4.2% of the total percentage of the reactive gases introduced to said CVD reactor.

8. The method of growing a diamond layer as recited in claim 1, wherein the concentration of the carbon-bearing gas is limited to 1.5% or less of the total percentage of reactive gases introduced to said CVD reactor for initial deposition onto an aluminum nitride adhesion layer.

9. The method of growing a diamond layer as recited in claim 1, wherein the concentration of the carbon-bearing gas is limited to 2.0% or less of the total percentage of reactive gases introduced to said CVD reactor for initial deposition onto a silicon nitride adhesion layer.

10. The method of growing a diamond layer as recited in claim 1, wherein the concentration of the carbon-bearing gas is limited to 3.0% or less of the total percentage of reactive gases introduced to said CVD reactor for initial deposition onto a silicon carbide adhesion layer.

11. The method of growing a diamond layer as recited in claim 1, wherein the concentration of the carbon-bearing gas is limited to 2.0% or less of the total percentage of reactive gases introduced to said CVD reactor for initial deposition onto an amorphous or crystalline silicon adhesion layer.

12. A compound semiconductor article having a diamond layer bonded to an adhesion layer in accordance with the method of claim 1.

13. A method of growing a diamond layer upon an adhesion layer coating a compound semiconductor substrate, comprising:
    loading the adhesion layer coated compound semiconductor substrate into a chemical vapor deposition (CVD) reactor;
    evacuating the CVD reactor down to the vacuum base pressure of the reactor;
    introducing reactive gasses into the reactor, wherein at least a one of the gasses is a carbon-bearing gas;
    establishing a process pressure in the reactor;
    setting a constant concentration of the carbon-bearing gas in the reactor;
    applying power to the reactor at any ramped rate to allow for the elastic deformation of the substrate, while at the same time avoiding any plastic deformation of the substrate; and
    maintaining the recited conditions to assure the growth of an adherent diamond layer upon the adhesion layer of the substrate.

14. The method of growing a diamond layer as recited in claim 13, wherein upon applying power to the reactor, a temperature differential of less than 80° Celsius is maintained between the center of the substrate and the edge of the substrate.

15. The method as recited in claim 14 further comprising the step of maintaining the final process temperature of the substrate at less than 1200° Celsius.

16. The method of growing a diamond layer as recited in claim 13, further comprising maintaining the recited conditions until a desired thickness of diamond layer is grown upon the adherent diamond layer.

17. The method of growing a diamond layer as recited in claim 1, wherein the process pressure in the reactor is maintained in a range of 5 to 500 Torr.

18. The method of growing a diamond layer as recited in claim 13, wherein the carbon bearing gas is a gas having four carbon atoms.

19. The method of growing a diamond layer as recited in claim 13, wherein the carbon bearing gas is selected from the group consisting of CH4, C2H6, C2H2 CO.

20. The method of growing a diamond layer as recited in claim 13, wherein the adhesion layer is selected from the group consisting of silicon nitride, aluminum nitride and silicon carbide.

21. The method of growing a diamond layer as recited in claim 13, wherein the carbon bearing gas is maintained at a concentration of between 0.3% to 4.2% of the total percentage of reactive gases introduced to said CVD reactor.

22. The method of growing a diamond layer as recited in claim 13, wherein the concentration of the carbon-bearing gas is limited to 1.5% or less of the total percentage of reactive gases introduced to said CVD reactor for initial deposition onto an aluminum nitride adhesion layer.

23. The method of growing a diamond layer as recited in claim 13, wherein the concentration of the carbon-bearing gas is limited to 2.0% or less of the total percentage of reactive gases introduced to said CVD reactor for initial deposition onto a silicon nitride adhesion layer.

24. The method of growing a diamond layer as recited in claim 13, wherein the concentration of the carbon-bearing gas is limited to 3.0% or less of the total percentage of reactive gases introduced to said CVD reactor for initial deposition onto a silicon carbide adhesion layer.

25. A compound semiconductor article having a diamond layer bonded to an adhesion layer in accordance with the method of claim 13.

* * * * *